United States Patent [19]

Doi et al.

[11] Patent Number: 5,629,566
[45] Date of Patent: May 13, 1997

[54] FLIP-CHIP SEMICONDUCTOR DEVICES HAVING TWO ENCAPSULANTS

[75] Inventors: Kazuhide Doi; Masayuki Miura; Takashi Okada; Naohiko Hirano, all of Kawasaki; Yoichi Hiruta, Kashiwa, all of Japan

[73] Assignee: Kabushiki Kaisha Toshiba, Kawasaki, Japan

[21] Appl. No.: 512,165

[22] Filed: Aug. 7, 1995

[30] Foreign Application Priority Data

Aug. 15, 1994  [JP]  Japan ................... 6-211711

[51] Int. Cl.$^6$ ............. H01L 23/12; H01L 23/48; H01L 23/28; H01L 23/29
[52] U.S. Cl. ................ 257/789; 257/711; 257/737; 257/738; 257/772; 257/778; 257/779; 257/780; 257/788; 257/790
[58] Field of Search .................. 257/711, 734, 257/737, 738, 772, 778, 779, 780, 787, 788, 789, 790

[56] References Cited

U.S. PATENT DOCUMENTS 3,401,126  9/1968  Miller .
3,429,040  2/1969  Miller .
5,315,155  5/1994  O'Donnelly et al. .............. 257/711
5,343,076  8/1994  Katayama et al. .................. 257/711

FOREIGN PATENT DOCUMENTS 60-94744  5/1985  Japan .................. 257/778

OTHER PUBLICATIONS

"Microelectronics Packaging Handbook", Van Nostrand Reinhold, p. 389 (1989).

*Primary Examiner*—Jerome Jackson, Jr.
*Assistant Examiner*—Carl Whitehead, Jr.
*Attorney, Agent, or Firm*—Finnegan, Henderson, Farabow, Garrett & Dunner, L.L.P.

[57] ABSTRACT

A semiconductor device includes a semiconductor chip which is connected to a circuit substrate via solder bumps by flip-chip connection, a first encapsulant having a large Young's modulus and filling a space between the semiconductor chip and the circuit substrate in the central portion of the semiconductor chip, and a second encapsulant having a small Young's modulus and filling a space between the semiconductor chip and the circuit substrate in the peripheral portion of the semiconductor chip. A method for manufacturing the semiconductor device includes flowing the second encapsulant into position, but not the first encapsulant.

18 Claims, 5 Drawing Sheets

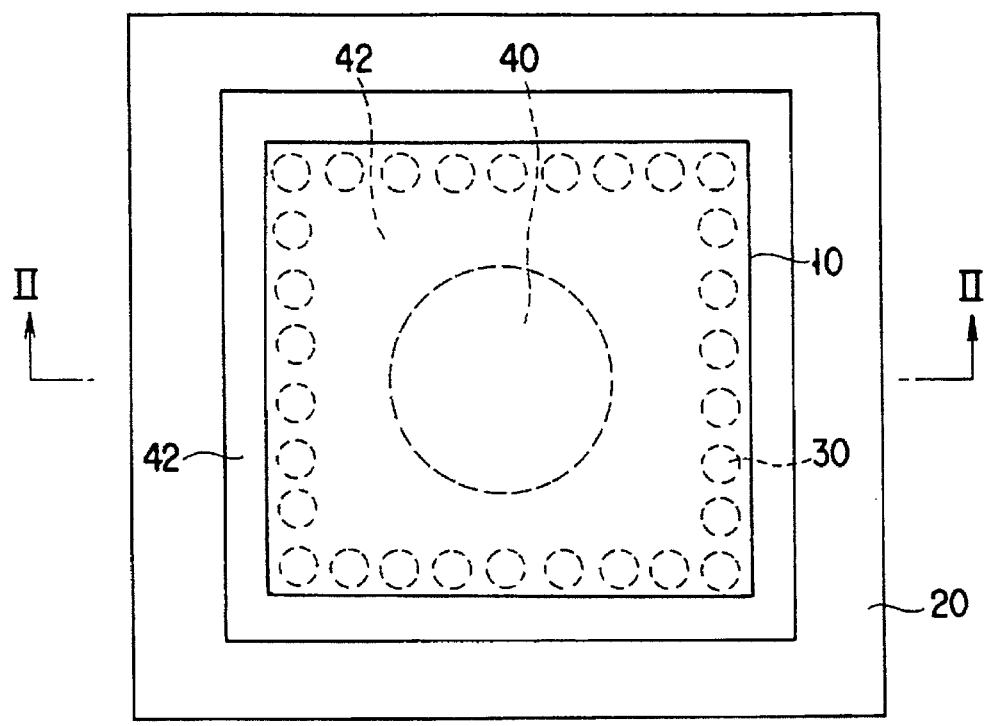
F I G. 1
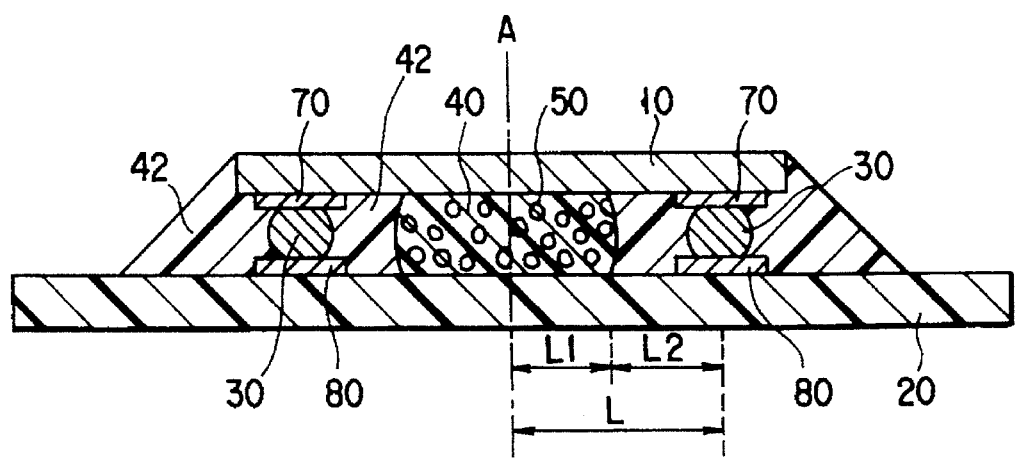
F I G. 2

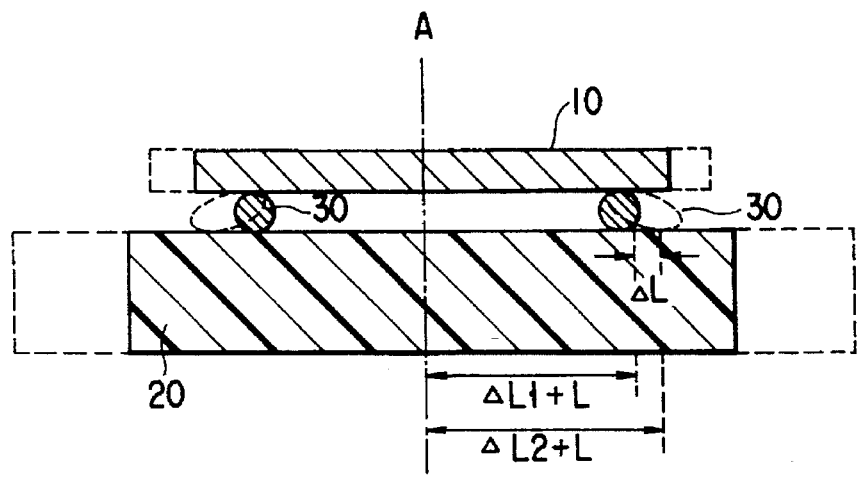
F I G. 3
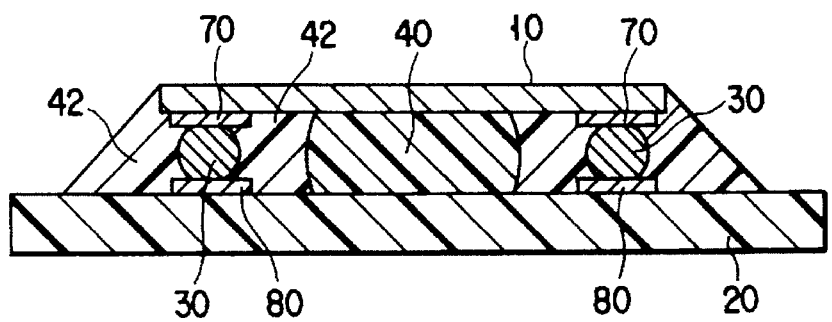
F I G. 4
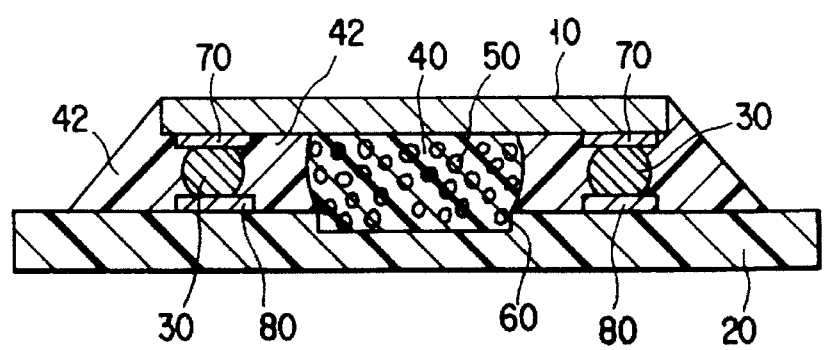
F I G. 5

FLIP-CHIP SEMICONDUCTOR DEVICES HAVING TWO ENCAPSULANTS

BACKGROUND OF THE INVENTION

1. Field of the Invention

This invention relates to a semiconductor device with structure in which the semiconductor element thereof is connected to a circuit substrate via bump electrodes such as solder bumps.

2. Description of the Related Art

Conventionally, in order to assemble the semiconductor element with the circuit substrate, methods of connecting the tips of multiple outer leads of the semiconductor element (which is hereinafter referred to as a chip) to the metallization pattern on the circuit substrate, or mounting the semiconductor chip directly on the circuit substrate to connect them to the metallization pattern by wire bonding or TAB (Tape Automated Bonding), have been used.

However, the method of providing outer leads on the chip and mounting them on the circuit substrate a serious impediment to the development of high density assembly technology for semiconductor devices. Particularly, in recent years, various applications of semiconductor devices have been made and high density assembly technology is advancing. For example, since there is a trend for a thin circuit substrate to be used and a trend for the number of mounting memory chips to increase as in a memory card, the method of assembling the chip by use of the outer leads has a limitation. Therefore, a flip chip method of connecting multiple connecting electrodes (bumps) formed on the chip directly to the metallization pattern of the circuit substrate has received much attention.

In the flip chip assembly, a silicon chip has a pad electrode formed on the surface thereof and electrically connected to an inner integrated circuit and a plurality solder bumps with the height of approx. 100 µm formed of low melting point metal on the pad. A plurality of chips are assembled on the circuit substrate by connecting the silicon chip to the metallization pattern formed on the surface of the circuit substrate with the chip surface set to face the circuit substrate. As a constituent material of the bump, gold may be used instead of the low melting point metal in some cases.

For flip chip connection using the low melting point metal, a method of preventing short circuits and collapse of the circuit element due to solder by making a portion of the metallization pattern other than a portion that is to be connected to the solder bumps non-wettable with respect to solder is disclosed in U.S. Pat. No. 3,401,126 Sept. 1968, L. F. Miller et al., and U.S. Pat. No. 3,429,040 Feb. 1969, L. F. Miller.

Generally, the temperature of a semiconductor device rises by heat generated from the chip at the time of operation. The heat generated from the chip is transmitted to the circuit substrate via the solder bumps to raise the temperature of the circuit substrate. At this time, the chip and circuit substrate thermally expand. In the flip chip connection, if there is a difference in the thermal expansion coefficient between the chip and the circuit substrate, thermal stress caused by the difference in the thermal expansion coefficient concentrates on the solder bump.

If no encapsulant is filled in between the chip and the circuit substrate, or an encapsulant having not so large Young's modulus is uniformly filled, the relative positions of the solder bump on the chip and the circuit substrate vary according to a difference between the thermal displacements thereof. The reliability of the solder bump depends on the reciprocal of a difference in the displacement between the upper surface and the lower surface of the solder bump caused when the semiconductor device is repeatedly operated. That is, as the difference in the displacement is larger, the stress more strongly concentrates on the solder bump and the long-term reliability of the semiconductor device is more degraded. Since the difference in the displacement varies in proportion to the distance from the center of the chip to the solder bump, it becomes more difficult to attain high long-term reliability in the present condition in which the integration density tends to be enhanced and the chip size tends to be increased.

Conventionally, the encapsulant filling method for stress alleviation is effected by temporarily fixing the chip on the metallization pattern of the circuit substrate, causing the solder bump to reflow so as to connect the same to the metallization pattern, then flowing epoxy or polyimide encapsulant into between the chip and the circuit substrate and curing the same. In this case, the result of evaluation of the reliability for epoxy is described in "Microelectronics Packaging Handbook", page 389, Van Nostrand Reinhold, 1989, R. R. Tummala et al.

Further, since the Young's modulus of silicone is too small, it is not used as the stress alleviating encapsulant in the prior art. In the encapsulated flip chip connection, in order to alleviate the stress concentrating on the solder bump, optimum material properties must be selected as the material properties of the encapsulant. The material properties of the encapsulant depend on the amount of fillers contained therein. The size of the filler is several µm to several ten µm and is normally 10 µm to 20 µm.

However, if the pitch of the flip chip connection is reduced with the trend of high integration density, the space between the solder bumps and the space between the chip and the circuit substrate are also made smaller. At this time, even if an encapsulant whose material properties such as the Young's modulus are optimized is selected, there occurs a problem that the encapsulant cannot enter a space between the circuit substrate and the chip since the size of the filler contained in the encapsulant is large. This problem becomes particularly important when the connection pitch is reduced to 100 µm or less.

Further, in the conventional flip chip assembly method, the chip and the circuit substrate are fixed mainly by the adhesive force of flux in a period from the time when the chip is temporarily fixed on the circuit substrate until the chip is connected by reflowing. At this time, as a material property of flux, adhesive force is necessary. A flux having strong adhesive force exhibits narrow spreading when it is coated; and the manufacturing efficiency thereof is low. Further, when the connection pitch is small, it is difficult to stably coat the flux with a small thickness on all of the electrodes. Further, in the fluxless connection, the fixing force of the chip on the circuit substrate is attained only by adhesive force of the solder obtained when the solder bump is pressed on the circuit substrate; and it tends to be unreliable.

As the other flip chip connection method, a connection method by gold-gold pressure is used. Also, this method includes a step of temporarily fixing the chip by coating an adhesive agent before alignment of the chip and the circuit substrate, but in the flip chip connection using the solder bump, the self-alignment effect can be expected when the solder bump is caused to reflow, and therefore, it is not preferable to fix the chip by use of adhesive agent before the reflowing as in the case of the connection method by gold-gold pressure.

SUMMARY OF THE INVENTION

This invention has been made in order to solve the above problems, and an object of this invention is to provide a semiconductor device having long-term reliability and connected to a circuit substrate via a solder bump by flip chip connection and a method of manufacturing the semiconductor device which is excellent in the manufacturing efficiency of connection.

A silicon chip used in the semiconductor device of this invention has a row of solder bumps connected to an internal integrated circuit and formed in the peripheral portion thereof. The semiconductor device of this invention is constructed by connecting the solder bumps directly to the circuit substrate by flip chip connection and has a feature that first and second encapsulants having different material properties are filled in between the chip and the circuit substrate.

That is, the semiconductor device of this invention includes at least one semiconductor chip connected to a metallization pattern on the circuit substrate via the solder bumps by flip chip connection, and first and second encapsulants having different Young's moduli and filled in between the semiconductor chip and the circuit substrate. The semiconductor device has a feature that the first encapsulant is filled between the central portion of the semiconductor chip, the second encapsulant is filled between the peripheral portion of the semiconductor chip containing the row of solder bumps, and the Young's modulus of the first encapsulant is larger than that of the second encapsulant.

The first encapsulant contains fillers and the second encapsulant may contain substantially no fillers. A concave surface may be formed in the circuit substrate and part of the first encapsulant filled in the central portion of the semiconductor chip may be fixed in the concave surface. The plane (boundary) shape of the concave surface may be square. Further, a stage (an elevated surface) having a plane shape of square may be formed instead of the concave surface and the first encapsulant may be filled in between the semiconductor chip and the stage. Further, the first encapsulant may be formed to contain metal fillers of good thermal conductivity, and a trench may be formed around the stage so as to interrupt the extra encapsulant overflowing into the area outside of the stage and prevent the solder bumps arranged in the peripheral portion of the chip from being short-circuited when the first encapsulant containing the metal fillers is filled in between the semiconductor chip and the stage.

With the above arrangement, since the first encapsulant filled in between the chip and the central portion of the circuit substrate has a larger Young's modulus than and is harder than the second encapsulant, the chip can be sufficiently stably fixed in the central portion of the chip. Further, since the first encapsulant is formed to contain the fillers and the second encapsulant is formed to contain no fillers, the second encapsulant can easily enter the narrow space between the chip and the circuit substrate and small spaces of a pitch of the row of solder bumps. Further, since the first encapsulant for fixing the central portion of the chip is present even after the semiconductor chip is repeatedly operated, a difference in the displacement between the upper surface and the lower surface of the solder bump due to the thermal expansion at the time of operation of the chip can be made small, and therefore, the long-term reliability of the solder bump can be prevented from being degraded. In addition, the reliability of the solder bump can be further enhanced by setting the thermal expansion coefficient of the second encapsulant equal to that of the solder bump.

A method of manufacturing the semiconductor device of this invention comprises a step of temporarily fixing a semiconductor chip on a circuit substrate by use of first encapsulant having a preset Young's modulus; a step of connecting the solder bump of the semiconductor chip to the circuit substrate by solder reflowing; and a step of flowing a second encapsulant having a Young's modulus smaller than the first encapsulant into between the semiconductor chip and the circuit substrate and then curing the first and second encapsulants.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

The present invention is best understood by reference to the accompanying drawings, in which:

FIG. 1 is a plan view showing a semiconductor device which is a first preferred embodiment of this invention;

FIG. 2 is a cross sectional view taken along the II—II line of the semiconductor device which is the first preferred embodiment of this invention;

FIG. 3 is a diagrammatic view showing the stress concentration on the solder bump at the time of operation;

FIG. 4 is a cross sectional view showing a semiconductor device of a second embodiment which is a modification of the semiconductor device of FIG. 2;

FIG. 5 is a cross sectional view showing a semiconductor device of a third embodiment which is a modification of the semiconductor device of FIG. 2;

DETAILED DESCRIPTION OF THE PREFERRED EMBODIMENTS

Figure 6:
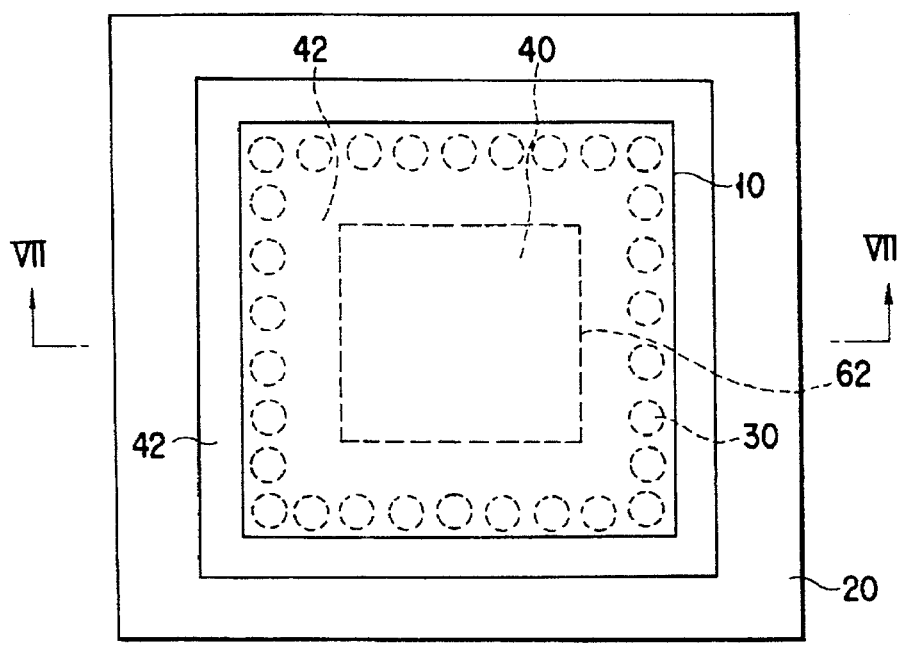
FIG. 6 is a plan view showing a semiconductor device of a fourth embodiment which is a modification of the semiconductor device of FIG. 5.

There will now be described an embodiment of this invention with reference to the accompanying drawings.

First, a first preferred embodiment is explained with reference to FIGS. 1 and 2. FIG. 1 is a plan view of a semiconductor device and FIG. 2 is a cross sectional view taken along the II—II line of FIG. 1. A semiconductor chip 10 includes pad electrodes 70 of, for example, aluminum connected to integrated circuits such as a memory and logic circuit formed therein, and bump electrodes 30 with a height of approx. 100 μm connected to the respective pad electrodes and formed of low melting point solder bumps containing lead and tin as main components. In FIG. 1, pad electrodes 70 on the chip 10 and a metallization layer 80 on the circuit substrate are not shown.

As shown in FIG. 1, the solder bumps 30 are arranged in the peripheral portion of the chip 10. The solder bumps 30 on the chip 10 are electrically connected to a metallization pattern formed on the surface of the circuit substrate 20. A plurality of chips are assembled on the circuit substrate 20. As the low melting point metal, lead-tin, indium-tin or the like is used. As the circuit substrate 20, a printing circuit board having laminated glass base plates impregnated with epoxy, a ceramic substrate of, for example, alumina, preferably, a ceramic substrate of good thermal conductivity formed of aluminum nitride or the like, or a silicon or sapphire single crystal substrate having a thermal expansion coefficient substantially or approximately equal to that of the chip is used.

Generally, the temperature of a semiconductor device rises by heat generated from the chip at the time of operation. The heat generated from the chip is transmitted to the circuit substrate via the solder bump to raise the temperature of the circuit substrate. At this time, the chip and circuit substrate thermally expand. In the flip chip connection as in this invention, if there is a difference in the thermal expansion coefficient between the chip 10 and the circuit substrate 20, thermal stress caused by the difference in the thermal expansion coefficient concentrates on the solder bump 30.

In this invention, in order to suppress the thermal stress, an encapsulant is filled into a space between the chip 10 and the circuit substrate 20 to seal the same. The encapsulant filled in between the chip 10 and the circuit substrate 20 includes a first encapsulant 40 such as epoxy disposed in the central portion of the chip 10 and a second encapsulant 42 such as epoxy disposed in the peripheral portion of the chip 10. Fillers 50 such as silica are added into the first encapsulant 40 and the Young's modulus thereof is made large, the second encapsulant 42 is formed to contain substantially no fillers or only an extremely small amount of fillers if any and the Young's modulus thereof is made small.

As described above, the chip 10 is connected to the circuit substrate 20 via the solder bumps 30 by flip chip connection, but now, the reliability of the semiconductor device having the solder bumps is explained. FIG. 3 shows the degree; of expansion of the chip and the circuit substrate caused by heat generated when the silicon chip 10 connected to the circuit substrate 20 by flip chip connection is used.

When no encapsulant is filled in between the chip and the circuit substrate, or an encapsulant whose Young's modulus is not so large is uniformly filled, the relative positions of the solder bump 30 with respect to the chip 10 and the circuit substrate 20 vary to cause a difference (ΔL) in the thermal displacement at the time of operation of the semiconductor device since there is a difference in the thermal expansion coefficient between the chip 10 and the circuit substrate 20. Therefore, if the difference in the displacement between the position of the solder bump on the chip side (upper side in the drawing) and the position thereof on the circuit substrate side (lower side in the drawing) when the semiconductor device is not operated is "0" and the distance from the central point A of the chip 10 to a preset one of the solder bumps 30 at the time of low temperature before the semiconductor device is operated is "L", then the distance from the point A to the solder bump 30 is extended by ΔL1 on the chip 10 side and by ΔL2 on the circuit substrate 20 side by the temperature rise at the time of operation of the semiconductor device, and therefore, the difference ΔL in the thermal displacement at the time of operation can be expressed by (ΔL2+L)−(ΔL1+L)=ΔL2−ΔL1.

The reliability of the solder bump depends on the reciprocal of a difference in the displacement between the upper surface and lower surface of the solder bump caused when the semiconductor device is repeatedly operated. That is, as the difference ΔL in the displacement becomes larger, the thermal stress more strongly concentrates on the solder bump and the reliability of the semiconductor device is degraded. Since the difference ΔL in the displacement shown in FIG. 3 varies in proportion to the distance from the center of the chip to the solder bump, the reliability is more degraded as the chip size becomes larger.

In contrast, in the semiconductor device of FIG. 2, for example, the first encapsulant 40 having a large Young's modulus is filled in the central portion of the chip 10 to stably fix the chip 10 of this portion (distance L1) on the circuit substrate 20. Therefore, a difference in the displacement between the chip 10 and the circuit substrate 20 does not occur in this portion. That is, this portion has no influence on the reliability of the solder bump. At this time, the reliability is determined by a portion (distance L2) of the second encapsulant 42 having a small Young's modulus ranging from the end of the first encapsulant 40 filled in the peripheral portion of the chip 10 to the solder bump 30 and a portion which influences the reliability becomes shorter than the distance L from the center of the chip 10 to the solder bump 30 (L>L2) in the conventional case, and therefore, degradation in the long-term reliability of the flip chip semiconductor device of this invention can be suppressed.

According to this invention, even when the chip size is increased, degradation in the reliability of the solder bump 30 can be prevented by increasing the distance L1 from the center of the chip 10 to the end of the first encapsulant 40 to fixedly set the distance L2 from the end of the first encapsulant 40 to the solder bump 30 in a range of 100 μm to 500 μm. The first encapsulant 40 is used to fix the chip 10 and the second encapsulant 42 is formed to have a thermal expansion coefficient set equal to that of the solder bump and is used to protect the solder bump. It is desirable to set the Young's modulus of the first encapsulant equal to or larger than 4 GPa, preferably, 4 GPa to 10 GPa. It is desirable to set the Young's modulus of the second encapsulant smaller than that of the first encapsulant and set the same equal to or smaller than 4 GPa, preferably, equal to or smaller than 1 GPa. The thermal expansion coefficient of the second encapsulant is set to the same value as or approximately equal to that of the solder bump and the material thereof is selected to suppress the thermal stress applied to the solder bump. It is suitable to use the material of the solder bump which contains lead-tin, indium-tin or the like as a main component, for example, and set the thermal expansion coefficient thereof to $20 \times 10^{-6}$/°C. to $40 \times 10^{-6}$/°C.

The feature of this embodiment is that the fillers 50 are added into the first encapsulant 40, the Young's modulus thereof is made large, substantially no fillers are added into the second encapsulant, and therefore, the Young's modulus thereof is kept small. Since substantially no fillers are added into the second encapsulant, the second encapsulant can smoothly flow into the space without being influenced by the filler particles even if the size of the semiconductor device is reduced and the space between the chip and the circuit substrate becomes extremely small. Further, the Young's modulus can be adequately changed by changing the added amount of fillers 50.

Conventionally, in order to prevent short circuit of the solder bump, electrically conductive fillers cannot be used as the fillers mixed into the encapsulant used for flip chip connection or the fillers mixed into the second encapsulant of this invention, but in the first encapsulant of this invention, the encapsulant is not filled in the peripheral portion of the bump connecting portion, thereby making it possible to use metal fillers such as silver. In this case, since the thermal conductivity is enhanced, a merit that heat generated in the silicon chip can be permitted to efficiently escape into the circuit substrate can be obtained. In either case, it is suitable to set the filler size used in this invention to several μm to several ten μm, preferably 10 μm to 20 μm.

Next, a second embodiment is explained with reference to FIG. 4.

FIG. 4 is a cross sectional view showing the same semiconductor device as that of FIG. 2. In this embodiment, the encapsulant filled in between the chip 10 and the circuit substrate 20 in the flip chip connection in the first embodiment is formed of a first encapsulant 40 such as epoxy disposed in the central portion of the chip 10 and having a large Young's modulus and a second encapsulant 42 such as silicone disposed in the peripheral portion of the chip 10 and having a small Young's modulus. The other portions are the same as the corresponding portions of the first embodiment.

The feature of the second embodiment is that different types of encapsulant materials having different Young's moduli are used to adequately form the first and second encapsulants having preset Young's moduli. By using epoxy having a large Young's modulus to form the first encapsulant 40 and using silicone having a shall Young's modulus to form the second encapsulant 42, preset Young's moduli can be respectively given to the first and second encapsulants as in the case of the first embodiment. Conventionally, silicone is not suitable for the encapsulant of the semiconductor device and is not often used since the Young's modulus thereof is too small, but in this embodiment, silicone is suitable for the second encapsulant disposed in the peripheral portion of the chip and can be used as an optimum sealing material.

In the semiconductor device in the second embodiment, the first encapsulant 40 having a large Young's modulus is filled in the central portion of the chip 10 to stably fix the chip 10 in this portion on the circuit substrate 20. Therefore, as is explained in the first embodiment, this portion comes to have no influence on the reliability of the solder bump. The second encapsulant 42 is formed to have the same thermal expansion coefficient as that of the solder bump so as to protect the same. A flip chip semiconductor device excellent in the long-term reliability can be obtained by setting the Young's moduli of the first and second encapsulants and the thermal expansion coefficient of the second encapsulant into the same ranges as in the first embodiment.

Next, a third embodiment is explained with reference to FIG. 5.

FIG. 5 is a cross sectional view showing a semiconductor device in the same manner as in FIG. 2. This embodiment has a feature that a concave surface 60 is formed in the surface of the circuit substrate 20 in which the first encapsulant is disposed. The chip can be fixed on the circuit substrate by filling the first encapsulant 40 in the concave surface 60. The other constituents, the numeric ranges of the Young's moduli of the first and second encapsulants, the numeric range of the thermal expansion coefficient of the second encapsulant, and the effect given by the above factors to the long-term reliability of the flip chip semiconductor device are the same as those of the first embodiment.

Next, a fourth embodiment is explained with reference to FIGS. 6 and 7.

Figure 7:
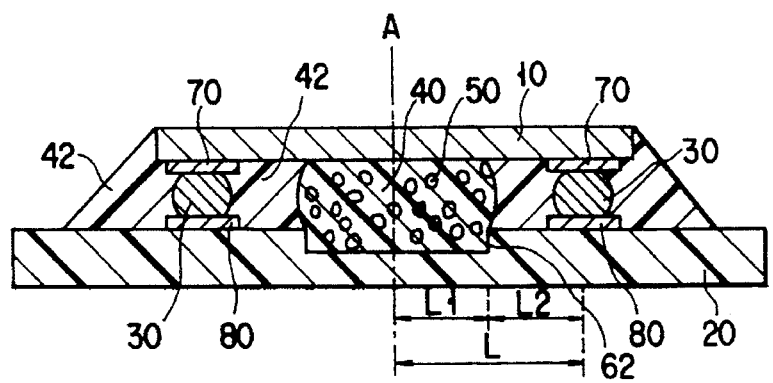
FIG. 7 is a cross sectional view taken along the VII—VII line of FIG. 6.

FIG. 6 is a plan view showing a semiconductor device and FIG. 7 is a cross sectional view taken along the line VII—VII of FIG. 6. The fourth embodiment has a feature that the plane shape of a concave surface 62 in the third embodiment is made in a rectangular form separated at a preset distance L2 from the solder bump 30 disposed in the peripheral portion of the chip 10 as shown in FIG. 6. Since the first encapsulant 40 is positioned by the concave surface in the rectangular shape by filling the first encapsulant into the concave surface 62, the bonding surface between the encapsulant 40 and the chip 10 can be made in substantially a rectangular form. By this method, since the distance from the end of the bonding surface to the center of the solder bump can be set to 100 μm to 200 μm, a difference in the thermal displacement between the chip 10 and the circuit substrate 20 can be further reduced and the long-term reliability of the semiconductor device can be enhanced. The other structure, the range of the material properties of the encapsulant and the effect given by these factors to the reliability are the same as those of the third embodiment.

Figure 8:
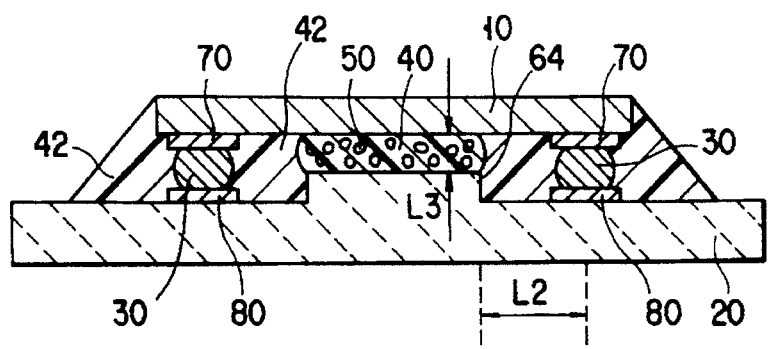
FIG. 8 is a cross sectional view showing a semiconductor device of a fifth embodiment which is a modification of the semiconductor device of FIG. 7.

Next, a fifth embodiment is explained with reference to FIG. 8. In the fifth embodiment, the rectangular concave 62 in the fourth embodiment is replaced by a rectangular stage 64 as shown in FIG. 8. The other structure and the numeric range of the material properties of the encapsulant are the same as those of the fourth embodiment. The stage is formed such that the end thereof is disposed at a preset distance L2 from the row of solder bumps on the chip. The first encapsulant 40 is positioned by the rectangular stage and, since a space L3 between the chip surface on which the solder bumps are disposed and the upper surface of the stage disposed on the circuit substrate can be set shorter than the height of the solder bump which is approx. 100 μm, the shape of the bonding surface between the first encapsulant 40 and the chip surface can be more precisely set to a rectangular form in comparison with the case of the fourth embodiment. With this structure, the distance from the end of the bonding surface to the center of the solder bump can be set in a range of 100 μm to 150 μm and the long-term reliability of the solder bump can be kept high.

Next, a sixth embodiment is explained with reference to FIGS. 9 and 10.

Figure 9:
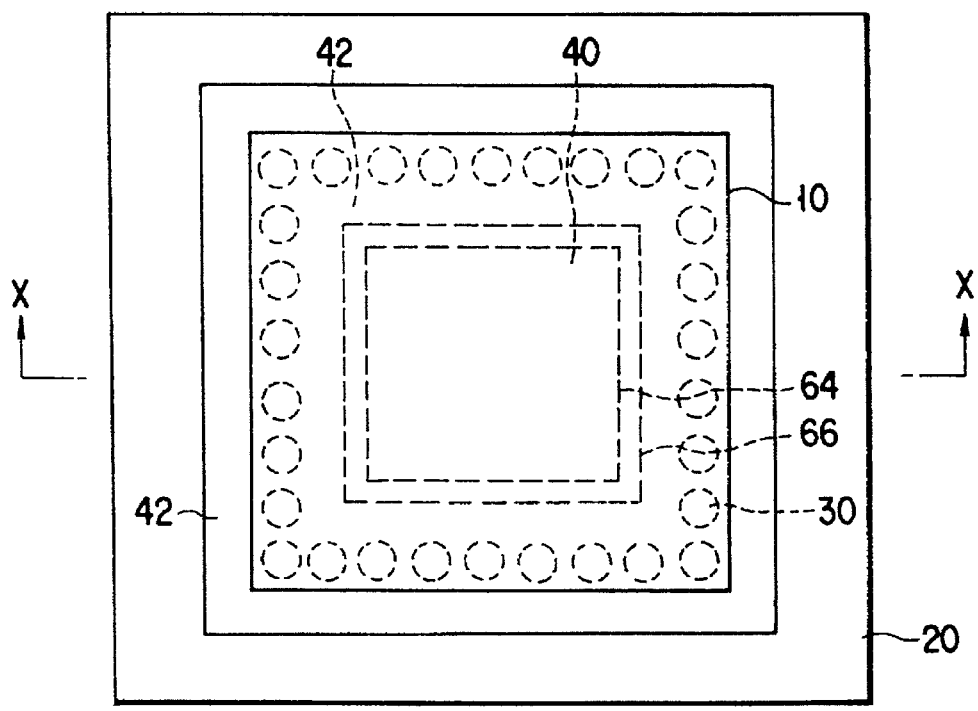
FIG. 9 is a plan view showing a semiconductor device of a sixth embodiment which is a modification of the semiconductor device of FIG. 8.
Figure 10:
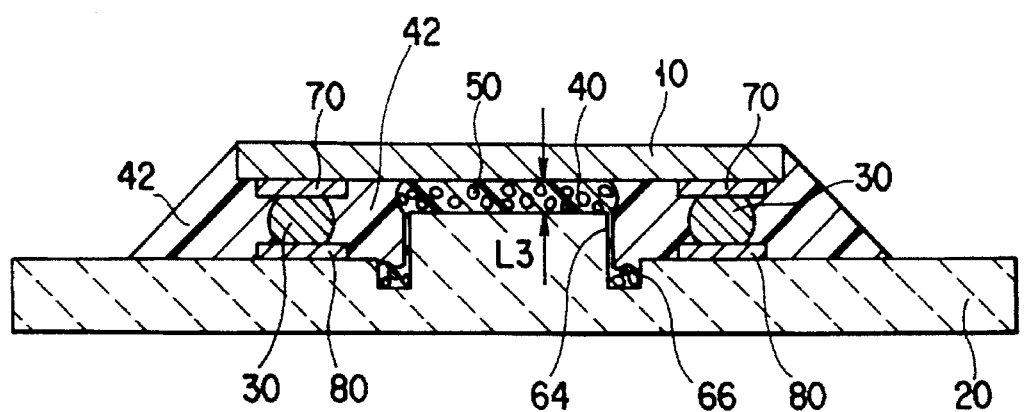
FIG. 10 is a cross sectional view taken along the X—X line of FIG. 9.

FIG. 9 is a plan view showing a semiconductor device and FIG. 10 is a cross sectional view taken along the line X—X of FIG. 9. The sixth embodiment has a feature that a trench 66 is formed around the rectangular stage 64 of the fifth embodiment and thermally conductive metal fillers, preferably silver fillers, are used as the fillers 50.

The role of the trench 66 in the sixth embodiment is to prevent that an extra portion of the first encapsulant 40 which overflows from the space between the chip surface and the upper surface of the stage flows to the metallization layer 80 formed on the circuit substrate before the curing step of the encapsulant and short-circuits the metallization layer 80 in a case wherein silver fillers are contained in the first encapsulant 40 in the fifth embodiment.

As shown in FIGS. 9 and 10, out-flow of the first encapsulant 40 containing the silver fillers to the metallization layer 80 can be prevented by the trench formed around the rectangular stage, thereby enhancing the manufacturing efficiency of flip chip connection. In the fifth embodiment, the short circuit failure by the silver fillers is prevented by strictly controlling the usage amount of the encapsulant 40 when the first encapsulant 40 containing the silver fillers is used, but by use of the structure of the sixth embodiment, such a failure will not occur even when the limitation of control is exceeded.

Figure 11:
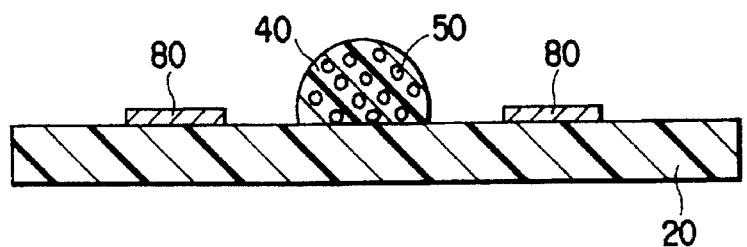
FIGS. 11 to 14 are cross sectional views showing a process of manufacturing a semiconductor device of a seventh embodiment of this invention.
Figure 12:
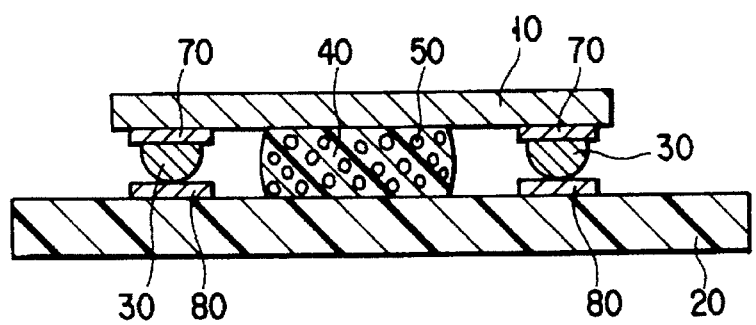

Next, a seventh embodiment is explained with reference to FIGS. 11 to 14. This embodiment is made to explain the process of manufacturing the semiconductor devices shown in the first to sixth embodiments. FIGS. 11 to 14 are cross sectional views corresponding to FIG. 2 and showing the respective manufacturing steps as an example. A metallization layer 80 with a preset pattern is formed on the circuit substrate 20. A first encapsulant 40 containing fillers and having a large Young's modulus is coated on the main surface of the circuit substrate on which the metallization layer is formed as shown in FIG. 11. Then, a silicon chip 10 is disposed on the first encapsulant 40 coated on the circuit substrate 20 and thus the chip 10 is temporarily fixed on the circuit substrate 20. At this time, the first encapsulant 40 is disposed and temporarily fixed at the center of the chip 10. A plurality of pad electrodes 70 are arranged along the four sides of the surface of the chip 10 and solder bumps 30 are formed on and connected to the respective pad electrodes 70. When the chip 10 is temporarily fixed on the first encapsulant 40, the solder bumps 30 are mounted on respective preset portions of the metallization layer 80 as shown in FIG. 12.

Figure 13:
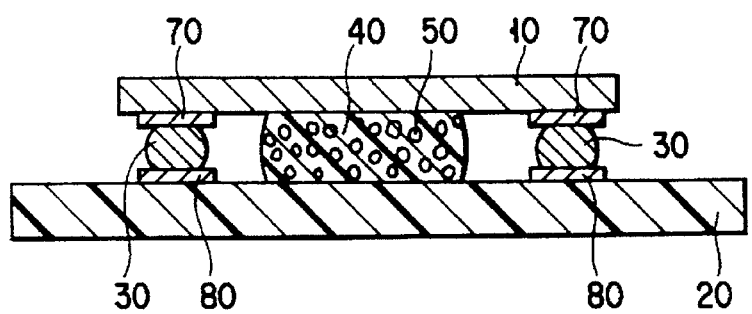
Figure 14:
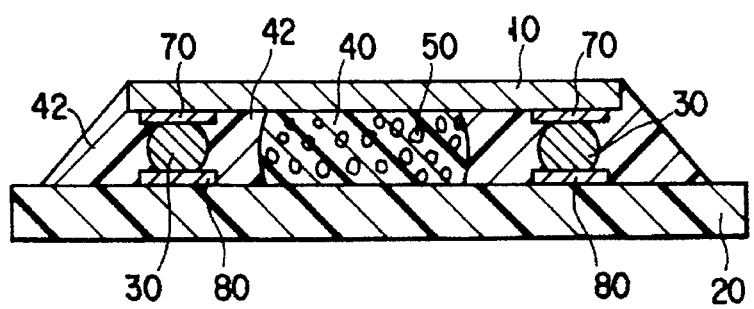

Next, the circuit substrate 20 is subjected to the heat treatment to cause the solder bumps 30 to reflow so as to connect the solder bumps to the chip by flip chip connection as shown in FIG. 13. Then, a second encapsulant 42 having a smaller Young's modulus than that of the first encapsulant 40 is caused to flow into a space between the chip 10 and the circuit substrate 20 as shown in FIG. 14. By effecting the heating and curing process after flowing the second encapsulant 42, a semiconductor device as shown in FIG. 2 can be obtained. It is clearly understood that the semiconductor devices whose cross sections are shown in FIGS. 4, 5, 7, 8 and 10 can be formed in the same manner as described above.

As described above, the first encapsulant among the encapsulants filled into the space between the chip and the circuit substrate is used to temporarily fix the chip. Thus, the first encapsulant is coated on the circuit substrate before the chip is fixed on the circuit substrate and it is not caused to flow into the space unlike the conventional case. Therefore, the amount of and the type of fillers added into the first encapsulant are not limited and the Young's modulus can be adequately set to a large value as required.

Further, since no fillers or substantially no fillers are required to be added into the second encapsulant, a problem that the encapsulant cannot enter the space between the chip and the circuit substrate because the size of the filler contained in the encapsulant is large will not occur even when the pitch of flip chip connection is reduced and the space between the solder bumps and the space between the chip and the circuit substrate are also reduced in size. Therefore, as the first and second encapsulants, encapsulants having required optimum material properties can be adequately selected and the reliability of the semiconductor device is enhanced. Further, silicone or the like which was not suitably used as the encapsulant material since the Young's modulus thereof is small can be optimally used as the second encapsulant and thus the range of material selection can be enlarged.

Further, since the chip is held on the circuit substrate by the adhesive force of the first encapsulant in a period from the time when the chip is temporarily fixed on the circuit substrate until it is connected by reflow, the reliability of the operation of flip chip connection can be enhanced in comparison with a conventional method of using the adhesive force of the reflow flux which is unstable to hold the chip. In order to maintain the self-alignment effect of the solder in the reflow step, the first encapsulant which is not cured in the fellow step is used. As the fillers, metal such as silver can be used as described before besides silica, talc.

As described above, according to this invention, the long-term reliability can be enhanced in the semiconductor device in which the chip is connected to the circuit substrate via the solder bumps by flip chip connection since less thermal stress is applied to the solder bumps in comparison with a conventional case. Further, since the fillers added to the second encapsulant can be eliminated or reduced to the least amount, the encapsulant can be easily caused to flow into between the chip and the circuit substrate, thereby enhancing the reliability of the connecting operation. Further, even if the chip size is increased and the connection pitch is reduced, the manufacturing process can be simplified.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   at least one semiconductor chip mounted on a circuit substrate and electrically connected to a metallization layer of said circuit substrate, a row of solder bumps being between a peripheral portion of said semiconductor chip and said metallization layer of said circuit substrate;
   a first encapsulant filling a first space between said semiconductor chip and said circuit substrate in the central portion of said semiconductor chip; and
   a second encapsulant filling a second space, exclusive of said first space, between said semiconductor chip and said circuit substrate in the peripheral portion of said semiconductor chip, said second space including said row of solder bumps totally within it,
   wherein said first encapsulant has a larger Young's modulus than said second encapsulant.

2. A semiconductor device comprising:
   at least one semiconductor chip mounted on a circuit substrate by use of solder bumps and electrically connected-to a metallization layer of said circuit substrate;
   a first encapsulant filled in a space between said semiconductor chip and said circuit substrate in the central portion of said semiconductor chip; and
   a second encapsulant filled in a space between said semiconductor chip and said circuit substrate in the peripheral portion of said semiconductor chip;

wherein said first encapsulant has a larger Young's modulus than said second encapsulant, and wherein the thermal expansion coefficient of said second encapsulant is substantially equal to that of said solder bumps.

3. The semiconductor device according to claim 1, wherein said first encapsulant contains fillers and said second encapsulant contains substantially no fillers.

4. The semiconductor device according to claim 2, wherein said first encapsulant contains fillers and said second encapsulant contains substantially no fillers.

5. The semiconductor device according to claim 1, wherein a concave surface is formed in said circuit substrate and part of said first encapsulant filled in the central portion of said semiconductor chip is fixed in said concave surface.

6. The semiconductor device according to claim 2, wherein a concave surface is formed in said circuit substrate and part of said first encapsulant filled in the central portion of said semiconductor chip is fixed in said concave surface.

7. The semiconductor device according to claim 3, wherein a concave surface is formed in said circuit substrate and part of said first encapsulant filled in the central portion of said semiconductor chip is fixed in said concave surface.

8. The semiconductor device according to claim 2, wherein said first encapsulant contains fillers and said second encapsulant contains substantially no fillers and a concave surface is formed in said circuit substrate and part of said first encapsulant filled in the central portion of said semiconductor chip is fixed in said concave surface.

9. The semiconductor device according to claim 5, wherein a concave surface having a rectangular plane shape is formed in said circuit substrate and part of said first encapsulant filled in the central portion of said semiconductor chip is fixed in said concave surface.

10. The semiconductor device according to claim 2, wherein a concave surface having a rectangular plane shape is formed in said circuit substrate and part of said first encapsulant filled in the central portion of said semiconductor chip is fixed in said concave surface.

11. The semiconductor device according to claim 7, wherein a concave surface having a rectangular plane shape is formed in said circuit substrate and part of said first encapsulant filled in the central portion of said semiconductor chip is fixed in said concave surface.

12. The semiconductor device according to claim 2, wherein said first encapsulant contains fillers and said second encapsulant contains substantially no fillers and a concave surface having a rectangular plane shape is formed in said circuit substrate and part of said first encapsulant filled in the central portion of said semiconductor chip is fixed in said concave surface.

13. The semiconductor device according to claim 1, wherein a stage having a rectangular plane shape is formed on said circuit substrate and said first encapsulant filling the central portion of said semiconductor chip is fixed on said stage.

14. The semiconductor device according to claim 2, wherein a stage having a rectangular plane shape is formed on said circuit substrate and said first encapsulant filling the central portion of said semiconductor chip is fixed on said stage.

15. The semiconductor device according to claim 3, wherein a stage having a rectangular plane shape is formed on said circuit substrate and said first encapsulant filling the central portion of said semiconductor chip is fixed on said stage.

16. The semiconductor device according to claim 2, wherein said first encapsulant contains fillers and said second encapsulant contains substantially no fillers and a stage having a rectangular plane shape is formed on said circuit substrate and said first encapsulant filling the central portion of said semiconductor chip is fixed on said stage.

17. The semiconductor device according to claim 3, wherein a stage having a rectangular plane shape is formed on said circuit substrate, a trench is formed around said stage, fillers of said first encapsulant filling the central portion of said semiconductor chip are metal fillers, and said first encapsulant is fixed on said stage.

18. The semiconductor device according to claim 2, wherein said first encapsulant contains fillers and said second encapsulant contains substantially no fillers, a stage having a rectangular plane shape is formed on said circuit substrate, a trench is formed around said stage, fillers of said first encapsulant filling the central portion of said semiconductor chip are metal fillers, and said first encapsulant is fixed on said stage.

* * * * *